(12) United States Patent
Hodjat

(10) Patent No.: US 6,572,962 B2
(45) Date of Patent: Jun. 3, 2003

(54) PARTICLE LOCK JOINT

(75) Inventor: Yahya Hodjat, Oxford, MI (US)

(73) Assignee: The Gates Corporation, Denver, CO (US)

( * ) Notice: Subject to any disclaimer, the term of this patent is extended or adjusted under 35 U.S.C. 154(b) by 77 days.

(21) Appl. No.: 09/834,854

(22) Filed: Apr. 12, 2001

(65) Prior Publication Data

US 2002/0148094 A1 Oct. 17, 2002

(51) Int. Cl.⁷ .............................. B32B 5/16; B23R 31/00
(52) U.S. Cl. ..................................... 428/323; 228/248.1
(58) Field of Search .............................. 428/411.1, 323; 228/120, 121, 122.1, 123.1, 135, 178, 903, 248.1, 248.5

(56) References Cited

U.S. PATENT DOCUMENTS

| | | | |
|---|---|---|---|
| 5,348,210 A | 9/1994 | Linzell | 228/115 |
| 5,837,066 A | 11/1998 | Linzell | 148/22 |
| 5,988,483 A | 11/1999 | Linzell | 228/115 |

*Primary Examiner*—Paul Thibodeau
*Assistant Examiner*—Sheeba Ahmed
(74) *Attorney, Agent, or Firm*—J. A. Thurnau, Esq.; C. H. Castleman, Esq.; S. G. Austin, Esq.

(57) ABSTRACT

The invention comprises a joint formed by mechanical interaction of particles with the parts to be joined. The particles engage an interface surface of each part, creating a high friction condition that prevents further relative movement of the parts once they are assembled. The particles have a substantially flat or flake-like morphology. The surface of each particle is rough to enhance mechanical engagement with each interface surface. The flake-like shape prevents the particle from penetrating an elastomeric part, which would render the particle ineffective in the bonding process.

16 Claims, 2 Drawing Sheets

PARTICLE LOCK JOINT

FIELD OF THE INVENTION

The invention relates to joints, and more particularly to joints comprising particles that mechanically interlock adjoining surfaces.

BACKGROUND OF THE INVENTION

It is well known in the mechanical arts that many methods are available to join or connect one part to another. These methods range from use of a chemical adhesive to welding.

Chemical adhesives generally adhere two surfaces by chemical interaction with the body materials. The joints can be of great strength and durability. The problem is that there are attendant environmental issues that arise with chemical adhesives, including storage, use and disposal of the adhesives. Further, they are often a health hazard to humans if used improperly. Chemical adhesives are primarily used on non-metallic materials, such as plastics and composites.

A welded joint is the primary means of joining metallic components. For example, electrical arc welding momentarily liquefies a portion of the bodies to be joined. The molten metal, in combination with metal from a welding rod, then solidifies to join the metallic bodies at a molecular level. The problem here is that some skill is required to weld properly. Further, high electrical currents, voltages and temperatures are necessary to liquefy the materials to be joined.

In addition to adhesives and welding, another 'non-fastener' option is the galled joint. Galling is a process by which two bodies may be joined as a result of high levels of friction evenly disrupting the relevant surfaces causing controlled transfer of surface material from one body to another to produce an array of mechanically meshing recesses and protrusions that couple together and interlock to resist further lateral motion.

Representative of the art is U.S. Pat. No. 5,348,210 to Linzell(1994) which discloses a method of making galled joints by asperity deformation using a material between the members leading to welding on a molecular level but not sufficient to raise a temperature to a level where bulk welding will occur.

Also representative of the art is U.S. Pat. No. 5,837,066 to Linzell(1998) which discloses a method of making galled joints between two metal joints in which there are gaps prior to formation which comprises a composition comprises small metal particles combined with a gall enhancing material.

The galling method teaches use of a gall-enhancing material or composition that facilitates the galling process. The gall-enhancing material generally comprises a polysiloxane, which increases the friction between the members to be joined. Further, the joints rely upon a precise manner of combining the members to allow the galled joint to be properly formed, including controlling clearances, alignment and joint forming velocity. In addition, the joints disclosed in '210 specifically teach against the use of grit in the joint. On the other hand, '066 does teach the use of particles in the joint, however, the particles are used to promote galling between the surfaces and are used in concert with gall-enhancing material, namely polymethylsiloxane, to create a gall-enhancing composition. Also, the particles are generally equiaxed, meaning each is substantially the same in 3 dimensions, such as a sphere, or a cube or any irregular shape. This promotes joining of parts having substantially the same hardness, i.e., metal parts. However, the methods do not lend themselves to joining parts having a substantial difference in hardness, such as a plastic and metal. In particular, when one part is an elastomer, and the other part is metal, then the equiaxed particles can penetrate the relatively soft elastomer and disappear in them.

What is needed is a particle joint comprising particles that mechanically interlock adjoining surfaces. What is needed is a particle joint comprising particles having a substantially flat shape. The present invention meets these needs.

SUMMARY OF THE INVENTION

The primary aspect of the present invention is to provide a particle joint comprising particles that mechanically interlock adjoining surfaces.

Another aspect of the invention is to provide a particle joint comprising particles having a substantially flat shape.

Other aspects of the invention will be pointed out or made apparent by the following description of the invention and the accompanying drawings.

The invention comprises a joint formed by mechanical interaction of particles with the parts to be joined. The particles engage an interface surface of each part, creating a high friction condition that prevents further relative movement of the parts once they are assembled. The particles have a substantially flat or flake-like morphology. The surface of each particle is rough to enhance mechanical engagement with each interface surface. The flake-like shape prevents the particle from penetrating an elastomeric part, which would render the particle ineffective in the bonding process.

BRIEF DESCRIPTION OF THE DRAWINGS

The accompanying drawings, which are incorporated in and form a part of the specification, illustrate preferred embodiments of the present invention, and together with a description, serve to explain the principles of the invention.

DESCRIPTION OF THE PREFERRED EMBODIMENT OF THE INVENTION

Figure 1:
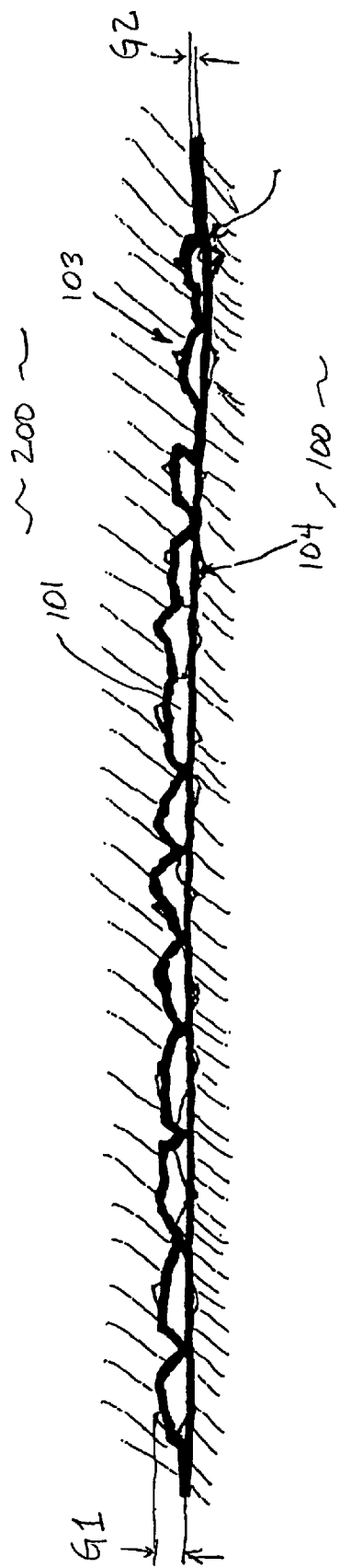
FIG. 1 shows a cross-section of a gap between two parts being joined.

FIG. 1 shows a cross-section of a gap between two parts being joined. The joint is generally between two or more concentric components having a press fit. A metallic material 100 and a non-metallic material 200 are shown in cross-section. Non-metallic material 200 may comprise an elastomer or any other material having a hardness less than the metallic material 100. Particles 101 engage each interface surface 103 and 104. Surface roughness 102, see FIG. 3, enhances the engagement of each particle with the interface surfaces.

The joint is shown having gaps G1 and G2 between the surfaces. In the preferred embodiment, gap G1 is in the range of slightly less than the particle thickness in each area. This is due to particle aprtial penetration in the metallic and elastomer material, particularly since the elastomer is under compression. The gap G2 is zero in those areas where there are no particles. As later described in this specification, it is also possible to create an interference fit between the metallic part and the non-metallic part. The non-metallic part may also comprise an elastomeric having a modulus. In the case of a rotation part such as a pulley, use of the elastomeric allows a rotating part to perform a damping function.

Figure 2:
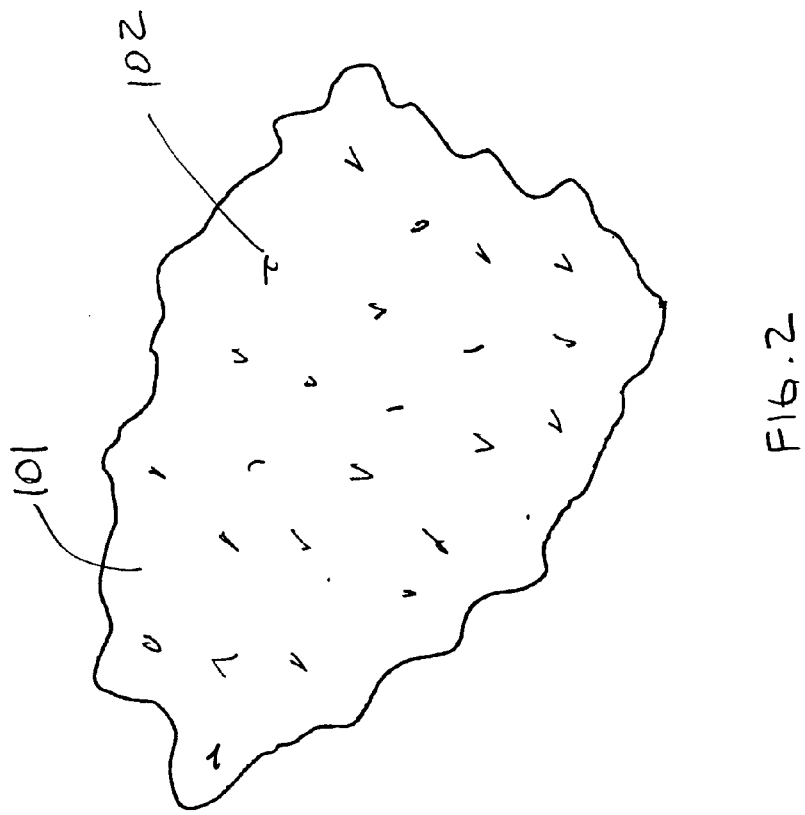
FIG. 2 shows a perspective view of a particle flake.
Figure 3:
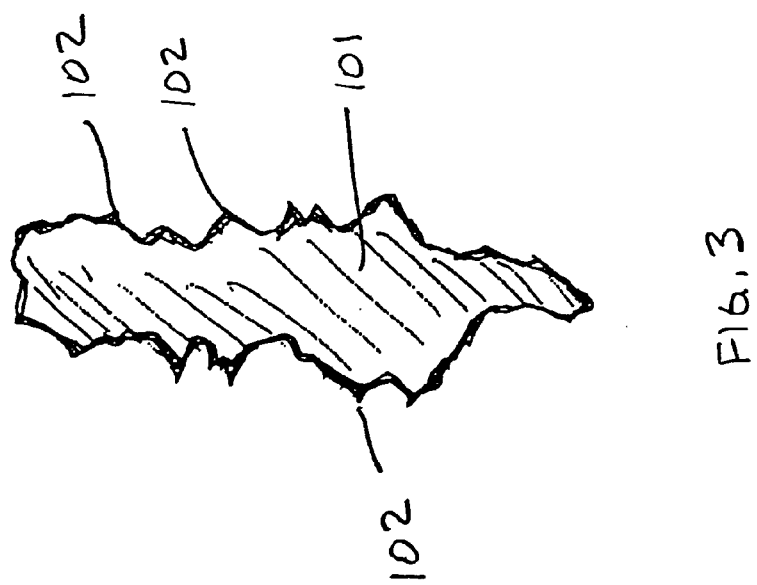
FIG. 3 is a side view of a particle flake.

The particles have a morphology of one plane being much larger than the others, i.e., a flake shape, with rough surfaces as shown in FIG. 2 and FIG. 3. What this does is allow the particle to mechanically "lock" to both surfaces without penetrating and 'disappearing' into the elastomer. The relatively large area of each particle prevents localized high pressures causing each particle to cut through the elastomer and penetrate in it. However, some slight amount of penetration of the particles into the elastomeric is acceptable. The particles may also score the interface surfaces during assembly which serves to enhance the mechanical engagement and further increase the friction between the surfaces.

Particles are made by several different processes, including from molten material, from solids, or by chemical reactions. When fabricated from molten material, a molten alloy (harder than the metallic part or the elastomer) is made into powder by atomization (blowing a high pressure inert gas such as argon into a stream of molten alloy) or by melt extraction.

In atomization, the number of nuzzles, their direction, plus volume, temperature, and pressure of the gas determines the size, and the shape of the particles. For particles larger than a few microns, it would also be possible to make equiaxed particles with atomization and subsequently send them through cylindrical rollers with rough surfaces. Millions of tons of powder from different materials are made each year by atomization for powder metal industry, drug and food industries.

For melt extraction, a wheel made of high temperature resistant alloy rotates on the surface of a bath of molten metal, touching the surface resulting the solidification of a very narrow amount of the metal on the wheel. As the wheel turns, the solidified material is blown away on the upper side of the wheel by an inert gas. The shape of the wheel and the depth of its penetration in the molten metal bath, determines the shape of particles. A rough wheel touching the bath very slightly will make flaky rough particles.

Mechanical methods of crushing and grinding are used more for ceramics and abrasives, such as what is used in sandpaper and construction industry. The particle shape from a mechanical crusher depends on the direction of forces (ball mill vs. parallel moving crushers), and the crystalline or amorphous (noncrystalline) structure of the mineral. Bonding between the atoms of a crystal is much stronger in some directions than others, resulting in crystal dependent particle shapes.

In the preferred embodiment, atomization with adjusted nuzzles is used to create the proper shape from an alloy steel, for example, D2, a tool steel that has high hardness and good wear resistance. High hardness is obtained by heat treating the material. The temperature of the gas blowing on the molten alloy does the heat treating.

The particles so created have a flake shape, see FIG. 2. As described previously, each flake 101 has a substantially flat surface. In order to facilitate joining between metallic 100 and non-metallic 200 parts, the surface of each flake has a surface roughness 102 for mechanically engaging each interface surfaces, 103 and 104. In the preferred embodiment, each flake has a mean diameter of 1 to 1000 microns.

Assembly of a Joint

The parts to be joined are first aligned in a jig or press to allow one part to be pressed into another. The particles are applied to the surfaces to be joined. They may be applied by pneumatic application or by use of a lubricant that facilitates the assembly process. In the preferred embodiment the particles are combined with a lubricant to enhance the initial sliding engagement during assembly.

The parts are then pressed together. During the pressing process the particles engage each adjoining interface surface. In the preferred embodiment a metallic material 100 is joined to a non-metallic material 200, such as an elastomeric. The non-metallic material is fabricated having a diameter or width slightly greater than the slot into which it is pressed by a factor of 5 to 45%, i.e., an interference fit. This allows the non-metallic material to be compressed between the metallic parts.

Even though the description is in terms of a cylindrical fit between parts, the method may be applied to any form of joint whereby a surface is held in pressing contact with another to which it is joined. Further the method may be applied to a wide range of joint shapes, including curved and staggered.

Although a single form of the invention has been described herein, it will be obvious to those skilled in the art that variations may be made in the construction and relation of parts without departing from the spirit and scope of the invention described herein.

I claim:

1. A method of making a joint between bodies comprising the steps of:

inserting between interface surfaces of the bodies a plurality of particles, said particles being combined with a friction reducing fluid to facilitate an initial sliding engagement between the bodies;

disposing an intermediate body between the two bodies, the intermediate body having a thickness and comprising a material having a hardness less than a hardness of the two bodies;

pressing the bodies together;

mechanically engaging the particles with an interface surface of the intermediate body and with a corresponding interface surface of each of the two bodies such that a relative movement of the bodies is prevented; and each particle having a hardness greater than a hardness of either of the two bodies or of the intermediate body, each particle having a flake-like morphology and each particle having a surface roughness.

2. The method as in claim 1, further comprising the step of:

assembling the two bodies and the intermediate body such that the particles partially mechanically penetrate each interface surface during assembly, thereby preventing a further relative movement of the bodies.

3. The method as in claim 1, wherein the intermediate body comprises an elastomeric material having a tensile modulus.

4. The method as in claim 1, wherein at least one of the two bodies comprises metal.

5. The method as in claim 1, further comprising the step of:

using particles having a mean diameter in the range of 1 to 1000 microns.

6. The method as in claim 3 further comprising the step of:

compressing the intermediate body between the two bodies.

7. The method as in claim 6, wherein the step of compressing the intermediate body between the two bodies reduces an intermediate body thickness in a range of 5% to 45%.

8. The method as in claim 7, wherein the tensile modulus is in the range of 300 to 1500 psi.

9. A joint between two bodies having a press fit comprising:

each body having an interface surface;

a plurality of particles combined with a lubricant each having a flake-like morphology mechanically engaged between the interface surfaces.

10. The joint as in claim 9, further comprising:

an intermediate body having interface surfaces to engage each of the two bodies, the intermediate body having a thickness and comprising a softer material than the two bodies; and the particles engaged between each interface surface of the intermediate body and a corresponding interface surface of each of the two bodies.

11. The joint as in claim 10, wherein:

the particles mechanically penetrate at least one interface surface during assembly, thereby preventing a further relative movement of the bodies.

12. The joint as in claim 11, wherein the intermediate body comprises an elastomeric material having a tensile modulus.

13. The joint as in claim 12, wherein the particles comprise a material having a hardness greater than the hardness of the two bodies or of the intermediate body.

14. The joint as in claim 13, wherein each particle further comprises a rough surface.

15. The joint as in claim 14, wherein at least one of the two bodies comprises a metallic material.

16. A joint between two bodies comprising:

at least two bodies, each body having an interface surface;

an intermediate body between each of the two bodies, the intermediate body having a thickness and comprising an elastomeric material and having an interface surface to engage a corresponding body interface surface; and a plurality of particles each having a flake-like morphology and combined with a lubricant, the particles mechanically engaged with each interface surface of the intermediate body and a corresponding interface surface of each of the two bodies.

* * * * *